United States Patent
Lee et al.

(10) Patent No.: US 7,514,863 B2
(45) Date of Patent: Apr. 7, 2009

(54) ORGANIC LIGHT EMITTING DEVICE

(75) Inventors: Jun-Yeob Lee, Suwon-si (KR); Min-Seung Chun, Suwon-si (KR)

(73) Assignee: Samsung Display Co., Ltd., Suwon-si (KR)

( * ) Notice: Subject to any disclaimer, the term of this patent is extended or adjusted under 35 U.S.C. 154(b) by 380 days.

(21) Appl. No.: 11/402,585

(22) Filed: Apr. 11, 2006

(65) Prior Publication Data
US 2006/0226770 A1 Oct. 12, 2006

(30) Foreign Application Priority Data
Apr. 12, 2005 (KR) .................. 10-2005-0030500

(51) Int. Cl.
*H01J 1/62* (2006.01)
(52) U.S. Cl. ...................... 313/504; 313/506
(58) Field of Classification Search ................ 313/498, 313/504, 506
See application file for complete search history.

(56) References Cited
U.S. PATENT DOCUMENTS
5,773,929 A 6/1998 Shi et al.
6,392,250 B1 5/2002 Aziz et al.
6,392,339 B1 5/2002 Aziz et al.
2006/0105200 A1* 5/2006 Poplavskyy et al. ......... 428/690

FOREIGN PATENT DOCUMENTS
JP 2004-327436 11/2004
TW 588572 5/2004

OTHER PUBLICATIONS

Patent Abstracts of Japan for Publication No. 2004-327436; Date of Publication of Application Nov. 18, 2004 in the name of Zheng-Hong Lu, et al.
Chinese Office action dated Aug. 8, 2008, for corresponding China application 200610072693.0, with English translation indicating relevance of listed reference in this IDS.

* cited by examiner

*Primary Examiner*—Vip Patel
(74) *Attorney, Agent, or Firm*—Christie, Parker & Hale, LLp

(57) ABSTRACT

Organic light emitting devices are provided. One organic light emitting device includes a buffer layer including a fullerene-based material and a hole injection layer and/or a hole transport layer doped with the fullerene-based material.

20 Claims, 1 Drawing Sheet

ORGANIC LIGHT EMITTING DEVICE

CROSS-REFERENCE TO RELATED APPLICATION

This application claims priority to and the benefit of Korean Patent Application No. 10-2005-30500, filed Apr. 12, 2005 in the Korean Intellectual Property Office, the entire content of which is incorporated herein by reference.

FIELD OF THE INVENTION

The present invention relates to an organic light emitting device (OLED), and more particularly, to an OLED including a fullerene-based material or a layer doped with a fullerene-based material.

BACKGROUND OF THE INVENTION

FIG. 1 is a cross-sectional view of a conventional OLED. Referring to FIG. 1, a conventional OLED 100 generally includes an anode 110, an organic layer 120, and a cathode 130. The anode 110 is disposed on a substrate 10. The substrate 10 may have at least one thin film transistor (not shown) connected to the anode 110. The organic layer 120 is disposed on the anode 110 and includes an organic emission layer 123. The organic layer 120 may have several component layers, but generally includes a hole injection layer 121, a hole transport layer 122, the organic emission layer 123, an electron transport layer 124, and an electron injection layer 125. The cathode 130 is disposed on the organic layer 120.

When a voltage is applied between the anode 110 and the cathode 130, a hole is injected from the anode 110 into the hole injection layer 121. The injected hole is transported into the organic emission layer 123 via the hole transport layer 122.

Also, an electron is injected from the cathode 130 into the electron injection layer 125 and then transported into the organic emission layer 123 via the electron transport layer 124.

The hole and the electron combine in the organic emission layer 123 to generate excitons which then transition from their excited state to the ground state to emit light.

The hole transport layer 122 should facilitate hole injection and have good hole transport properties. Also, the hole transport layer 122 may block the transfer of electrons and has a high glass transition temperature (Tg) to maintain stability even when the temperature varies.

To lengthen the OLED's life span (which is the device's biggest disadvantage), it is necessary to prevent diffusion of oxygen, ions, or small molecules from the hole transport layer 122. Accordingly, a dense thin film having a high glass transition temperature (Tg) may be formed, thereby minimizing the deterioration of the life span due to the hole transport layer. Examples of such methods for lengthening the life span of the OLED by improving the hole transport layer 122 include doping a fluorescent illuminant on the hole transport layer 122, and doping a fluorescent illuminant on the hole transport layer 122 and the organic emission layer 123.

SUMMARY OF THE INVENTION

In one embodiment of the present invention, an organic light emitting device (OLED) has increased life span and improved current injection properties due to smoothed hole injection and regulated electron injection.

In another embodiment of the present invention, a method of fabricating an OLED reduces the driving voltage and increases life span without decreasing efficiency.

According to one embodiment of the invention, an OLED includes a substrate, an anode formed on the substrate, a buffer layer formed on the anode and comprising a fullerene-based material, an organic layer including at least an organic emission layer formed on the buffer layer, and a cathode formed on the organic layer.

In another embodiment, the OLED includes a substrate, an anode formed on the substrate, a buffer layer formed on the anode and comprising a fullerene-based material, at least one of a hole injection layer and a hole transport layer doped with a fullerene-based material and formed on the buffer layer, an organic emission layer formed on the at least one of a hole injection layer and a hole transport layer, and a cathode formed on the organic emission layer.

The fullerene-based material may be selected from the group consisting of $C60, C70, C76, C78, C82, C84, C90, C94$ and $C96$.

The buffer layer may have a thickness ranging from about 1 to about 5 nm. In one embodiment, the buffer layer has a thickness of about 5 nm.

The hole injection layer or hole transport layer may include multiple layers. The hole injection layer may comprise a material selected from the group consisting of CuPc (copper phthalocyanine), 4,4',4"-tris(N-(1-naphthyl)-N-phenyl-amino)-triphenylamine (TNATA), 4,4',4"-tri(N-carbazolyl) triphenylamine (TCTA), 1,3,5-tris(N,N-bis-(4,5-methoxyphenyl)-aminophenyl)benzol (TDAPB), 4,4',4"-tris(N,N-diphenyl-amino)-triphenylamine (TDATA), polyaniline (PANI), and poly(3,4)-ethylenedioxythiophene (PEDOT). The hole injection layer may be doped with the fullerene-based material to a concentration ranging from about 1 to about 30 wt %.

The hole transport layer may comprise a material selected from the group consisting of N,N'-dinaphthyl-N,N'-diphenyl benzidine (NPD), N,N'-bis-(3-methylphenyl)-N,N'-bis-(phenyl)-benzidine (TPD), 2,2',7,7'-diphenyl-aminospiro-9,9'-bi-fluorene (s-TAD), 4,4',4"-Tris(N-3-methylephenyl-N-phenyl-amino)-triphenylamine (MTDATA), and poly-N-vinyl-carbazole (PVK). The hole transport layer may be doped with the fullerene-based material to a concentration of about 2 wt % or less. In one embodiment, the hole transport layer is doped with the fullerene-based material to a concentration of about 2 wt %.

The lowest unoccupied molecular orbital (LUMO) of the hole transport material of the hole transport layer may be lower in energy than that of the fullerene-based material.

The OLED may further include a hole blocking layer, an electron transport layer and/or an electron injection layer.

The buffer layer may be formed by vapor deposition, and the hole injection layer and/or the hole transport layer doped with a fullerene-based material may be formed by vapor deposition, spin coating or ink-jet printing.

The organic emission layer may comprise aluminum tris (8-hydroxyquinoline) (Alq3) and have a thickness ranging from about 20 to about 30 nm. In one embodiment, the organic emission layer has a thickness of about 25 nm. The cathode may comprise LiF and Al and have a thickness ranging from about 250 to about 350 nm. In one embodiment the cathode has a thickness of about 300 nm.

BRIEF DESCRIPTION OF THE DRAWINGS

The above features and advantages of the present invention will be better understood by reference to the detailed description when considered in conjunction with the accompanying drawings in which.

DETAILED DESCRIPTION OF THE INVENTION

The present invention will now be described with reference to the accompanying drawings, in which exemplary embodiments of the invention are shown. It is understood, however, that the drawings are provided for illustrative purposes only, and are not to be construed as limiting the present invention. Throughout the specification, like numerals refer to like elements.

Figure 1:
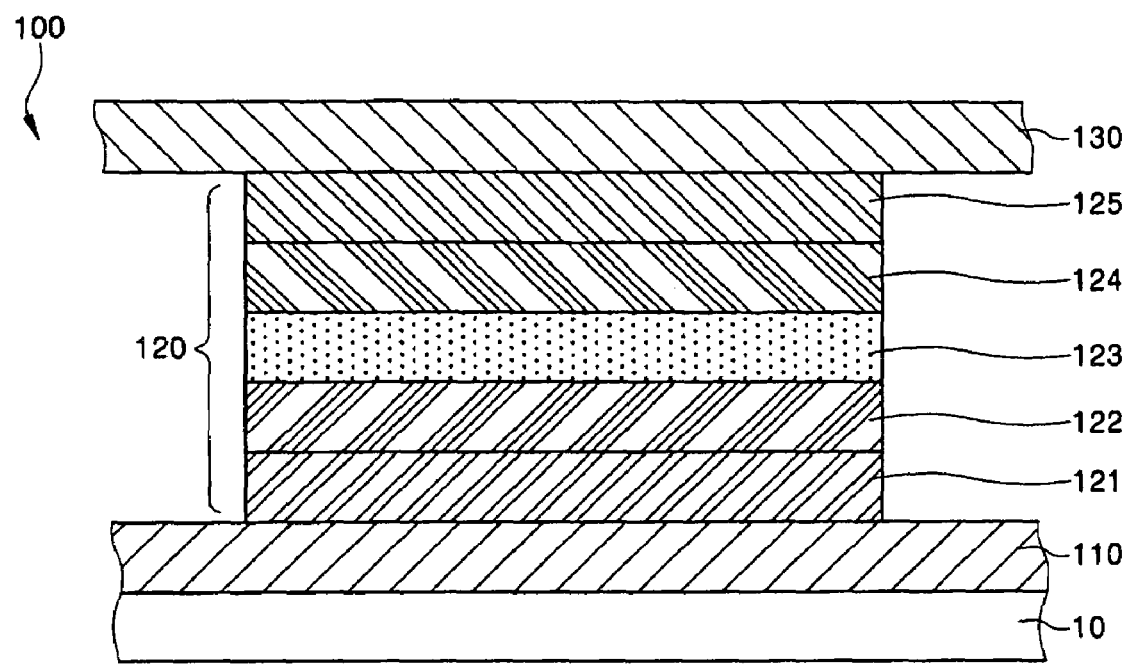
FIG. 1 is a cross-sectional view of a prior art organic light emitting device (OLED)
Figure 2:
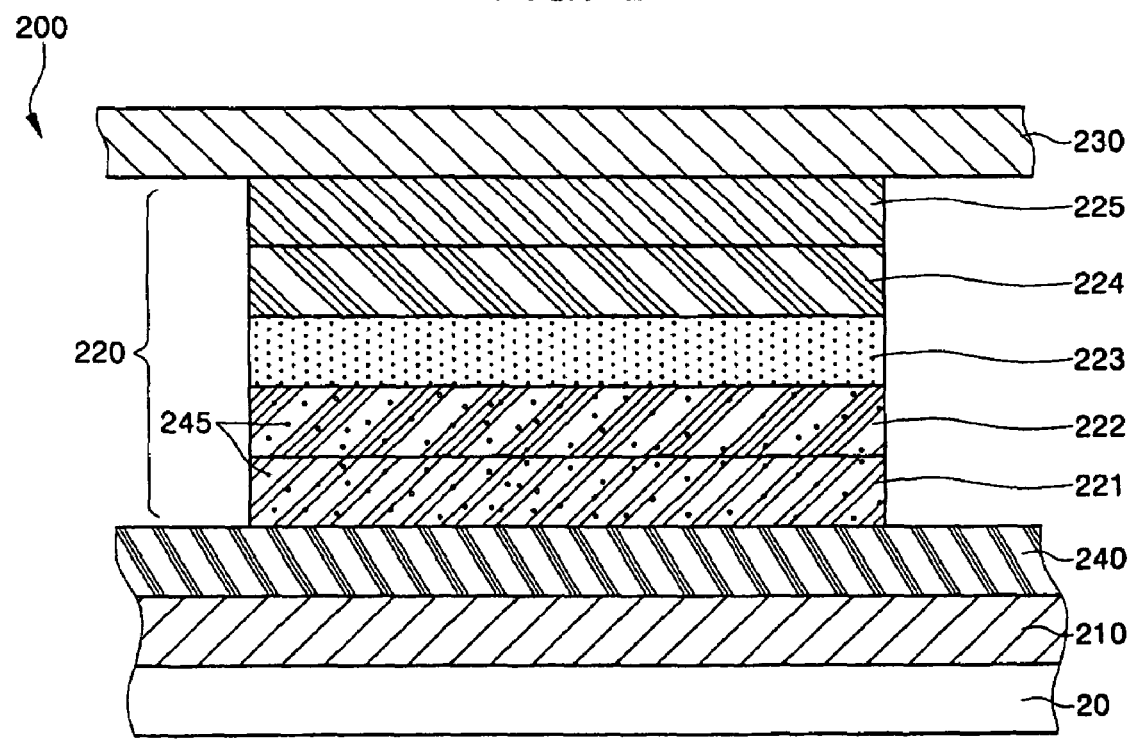
FIG. 2 is a cross-sectional view of an OLED according to one embodiment of the present invention.

FIG. 2 is a cross-sectional view of an OLED according to one embodiment of the present invention. Referring to FIG. 2, an OLED 200 includes an anode 210 formed on a substrate 20, an organic layer 220, a cathode 230, and a buffer layer 240 positioned between the anode 210 and the organic layer 220.

The substrate 20 may include at least one thin film transistor (not shown) connected to the anode 210.

The anode 210 may be transparent or reflective. If the anode 210 is transparent, it may comprise an indium tin oxide (ITO) layer, an indium zinc oxide (IZO) layer, a tin oxide (TO) layer, or a zinc oxide (ZnO) layer. If the anode 210 is reflective, it may comprise a silver layer, an aluminum layer, a nickel layer, a platinum layer, a palladium layer, a metal alloy layer containing an alloy of silver, aluminum, nickel, platinum or palladium, or a metal alloy layer having a transparent oxide layer such as ITO, IZO, TO or ZnO stacked on the metal alloy layer.

The anode 210 may be formed by sputtering, vapor phase deposition such as evaporation, ion beam deposition, electron-beam deposition, or laser ablation.

The buffer layer 240 is disposed on the anode 210. The buffer layer 240 comprises a fullerene-based material. Fullerene is a naturally-occurring organic material consisting of carbon atoms linked together like the seams of a soccer ball to form a shape called a buckyball. The fullerene material is strong and smooth and can confine a very small material. Also, the fullerene material may open, enabling another material to be inserted, and fullerene materials may be linked together like tubes.

The fullerene-based material may include a material selected from the group consisting of C60, C70, C76, C78, C82, C84, C90, C94 and C96.

C60 includes 60 carbon atoms and has a soccer ball-shaped structure. The fullerene-based material acts as a strong electron acceptor and facilitates transfer of holes to a hole injection layer 221, as will be explained later with reference to the tunneling effect and the p-doping effect. If the buffer layer 240 comprising the fullerene-based material has a thickness of more than 5 nm, it functions as an insulating layer and causes a rise in the driving voltage. However, if the buffer layer 240 has a thickness of less than 1 nm, hole transfer is not sufficiently enhanced. Thus, the buffer layer 240 has a thickness ranging from about 1 to about 5 nm to reduce driving voltage. In one embodiment, the buffer layer 240 has a thickness of about 5 nm.

The buffer layer 240 may be formed by vapor deposition.

The organic layer 220 is disposed on the buffer layer 240. The organic layer 220 includes at least an organic emission layer 223. In one exemplary embodiment of the present invention, as shown in FIG. 2, the organic layer 220 has a hole injection layer 221, a hole transport layer 222, the organic emission layer 223, an electron transport layer 224, and an electron injection layer 225. However, the present invention is not limited to the illustrated embodiment and various structures can be used, for example, by removing certain layers including the hole injection layer 221, the hole transport layer 222, the electron transport layer 224, and the electron injection layer 225. Alternative structures may also be formed by providing multiple layers.

The hole transport layer 222 is disposed on the hole injection layer 221. The hole transport layer 222 facilitates transfer of holes to the organic emission layer 223 and comprises a small molecule material such as NPD, TPD, s-TAD, or MTDATA, or a polymer material such as PVK.

The hole injection layer 221 and the hole transport layer 222 are doped with a fullerene-based material. The fullerene-based material serves as a dopant 245 and can be selected from the group consisting of C60, C70, C76, C78, C82, C84, C90, C94 and C96.

The hole injection layer 221 and the hole transport layer 222, which are doped with the fullerene-based material, may be formed by vapor deposition, spin coating, or ink-jet printing.

The dopant 245 doped into the hole injection layer 221 facilitates hole transfer, and is doped into the hole injection layer 221 to a concentration ranging from about 1 to about 30 wt % based on the total weight of the hole injection layer 221. A concentration of less than 1 wt % may be ineffective, and a concentration of more than 30 wt % may interfere with current injection.

When electrons are injected from the organic emission layer 223, the dopant 245 in the hole transport layer 222 prevents deterioration of the hole transport material by accepting the electrons.

In one embodiment, the lowest unoccupied molecular orbital (LUMO) of the hole transport material of the hole transport layer 222 is lower than that of the dopant 245 (the fullerene-based material). The LUMO is the orbital with the lowest energy level among the orbitals not occupied by electrons. The dopant 245 can accept the electrons injected from the organic emission layer 223 due to its higher energy level, thereby preventing deterioration of the hole transport material.

The dopant 245 is doped into the hole transport layer 222 to a concentration of about 2 wt % or less based on the total weight of the hole transport layer 222. In one embodiment, the dopant 245 is doped to a concentration of about 2 wt %. A dopant concentration over 2 wt % lowers doping efficiency.

In this embodiment, the hole injection layer 221 and the hole transport layer 222 are each formed as a single layer. However, in alternative embodiments, one of the layers may be removed, or either or both of them may comprise multiple layers. The organic emission layer 223 is disposed on the hole transport layer 222. The organic emission layer 223 may be a phosphorescent layer or a fluorescent layer. If the organic emission layer 223 is a fluorescent layer, it may include a material selected from the group consisting of Alq3, distyryl arylene (DSA), DSA derivatives, distyryl benzene (DSB), DSB derivatives, 4,4'-bis(2,2'-diphenyl vinyl)-1,1'-biphenyl (DPVBi), DPVBi derivatives, 2,2',7,7'-tetrakis(2,2-diphenylvinyl)spiro-9,9'-bifluorene (spiro-DPVBi), and 2,2',7,7'-tetrakis(biphenyl-4-yl)-9,9-spirobifluorene (spiro-sexiphenyl or spiro-6P). Furthermore, the organic emission layer 223 may have a dopant material selected from the group consisting of styrylamines, pherylenes, and distyrylbiphenyls (DSBPs).

If the organic emission layer 223 is a phosphorescent layer, it may include a host material selected from the group consisting of arylamines, carbazoles, and spiros. In one embodiment, the host material is selected from the group consisting of 4,4-N,N dicarbazole-biphenyl (CBP), CBP derivatives, N,N-dicarbazolyl-3,5-benzene (mCP), mCP derivatives, and spiro derivatives. In addition, the organic emission layer 223 may include a dopant material comprising a phosphorescent organometallic complex having a central metal selected from the group consisting of Ir, Pt, Tb, and Eu. The phosphorescent organometallic complex may be selected from the group consisting of tris(1-phenylquinoline) iridium (PQIr), bis(1-phenylquinoline)-acetylacetonate-iridium (PQIr(acac)), $PQ_2Ir$(acac), bis(1-phenylisoquinoline)acetylacetonate iridium (PIQIr(acac)), and platinum-octaethylporphyrin (PtOEP).

In a full-color OLED, the organic emission layer 223 may be formed by vapor deposition using a high-precision mask, ink jet printing, or laser thermal transfer.

The organic emission layer 223 has a thickness ranging from about 15 to about 40 nm. In one embodiment, the organic emission layer 223 has a thickness of about 30 nm. If the thickness of the organic emission layer 223 is less than 15 nm, efficiency is decreased. If the thickness of the organic emission layer 223 is greater than 40 nm, driving voltage increases.

A hole blocking layer (HBL) may be disposed on the organic emission layer 223. However, the hole blocking layer may be omitted when the organic emission layer 223 is a fluorescent layer. The hole blocking layer prevents excitons generated in the organic emission layer 223 from diffusing during driving of the OLED. The hole blocking layer may comprise aluminum (III) bis(2-methyl-8-quinolinato) 4-phenylphenolate (Balq), bathocuproine (BCP), polymerized fluorocarbon (CF-X), 3-(4'tert-butylphenyl)-4-phenyl-5-(4''-biphenyl) -1,2,4-triazole (TAZ), or spiro-TAZ. The electron transport layer (ETL) 224 and the electron injection layer (EIL) 225 are formed on the organic emission layer 223. The electron transport layer 224 facilitates transfer of electrons to the organic emission layer 223 and may comprise a polymer material such as 2-(4-biphenylyl)-5-(4-tert-butylphenyl)-1,3,4-oxadiazole (PBD), TAZ, or spiro-PBD, or a small molecule material such as Alq3, BAlq, or bis(2-methyl-8-quinolinolato)-(triphenylsiloxy)aluminium(III) (SAlq). The electron injection layer 225 facilitates injection of electrons into the organic emission layer 223 and may comprise Alq3, LiF, a Ga complex, or PBD.

The electron transport layer 224 and the electron injection layer 225 can be formed by vacuum deposition, spin coating, ink-jet printing, or laser thermal transfer.

According to one embodiment, the organic layer 220 comprises the hole injection layer 221 doped with the fullerene material, the hole transport layer 222, the organic emission layer 223, the electron transport layer 224, and the electron injection layer 225.

The cathode 230 can include LiF or Al and is positioned on the organic layer 220 so that the organic layer 220 including the organic emission layer 223 is positioned between the anode 210 and the cathode 230.

The cathode 230 has a thickness ranging from about 250 nm to about 350 nm. In one embodiment, the cathode 230 has a thickness of about 300 nm.

The organic light emitting device 200 is encapsulated in a metal can with barium oxide.

Examples of the present invention are presented below. These examples are provided for illustrative purposes only and are not to be construed as limiting the scope of the invention.

EXAMPLE 1

A 1 nm thick C60 buffer layer was prepared for an OLED. A NPD hole transport layer was deposited in a vacuum. A 25 nm thick Alq3 organic emission layer was then deposited. An electron transport layer was formed on the organic emission layer. A 300 nm thick LiF/Al cathode was then deposited. Then, the OLED was encapsulated in a metal can with barium oxide.

EXAMPLE 2

An OLED was prepared as in Example 1, except that the buffer layer had a thickness of 3 nm.

EXAMPLE 3

An OLED was prepared as in Example 2, except that the buffer layer had a thickness of 5 nm.

EXAMPLE 4

An OLED was prepared as in Example 1, except that a hole transport layer was vacuum-deposited. The hole transport layer included NPD and C60 in a ratio of 1:0.02 and the C60 was present at a concentration of 2 wt %.

EXAMPLE 5

An OLED was prepared as in Example 4, except that the buffer layer had a thickness of 3 nm.

EXAMPLE 6

An OLED was prepared as in Example 4, except that the buffer layer had a thickness of 5 nm.

COMPARATIVE EXAMPLE

An OLED was prepared as in Example 1, except that no buffer layer was used.

Table 1 lists measurements of driving voltage and efficiency of the OLEDs prepared in Examples 1 to 6 and the Comparative Example. Referring to Table 1, in Examples 1 to 6, the driving voltage measured from 7.5 to 8.6 V, which is superior to the 9V driving voltage of the Comparative Example. Moreover, when the hole transport layer contained fullerene as a dopant at a concentration of 2 wt % (Examples 4 to 6), the driving voltage was 0.3 to 1.1 V lower than that of the OLED of Examples 1 to 3 using NPD without the fullerene dopant. Efficiency measurements were similar among the OLEDs of Examples 1 to 6 and the Comparative Example.

TABLE 1

| | Thickness of buffer layer (nm) | HTL (Composition Ratio) NPB:C60 | Driving Voltage (V) | Efficiency |
|---|---|---|---|---|
| Comparative Example | 0 | 100:0 | 9 | 2.8 |
| Example 1 | 1 | 100:0 | 8.6 | 2.6 |
| Example 2 | 3 | 100:0 | 8.4 | 2.6 |
| Example 3 | 5 | 100:0 | 8.3 | 2.7 |
| Example 4 | 1 | 100:2 | 7.5 | 2.8 |
| Example 5 | 3 | 100:2 | 7.8 | 2.7 |
| Example 6 | 5 | 100:2 | 8 | 2.8 |

When the OLEDs of Examples 1 to 6 were driven at a brightness of 900 cd/m$^2$, their average half-lives were at least 500 hours. This translates into an improvement in life span by 5 times or more compared to the half-life of 100 hours exhibited by the Comparative Example in which the hole transport layer was not doped with fullerene and no buffer layer was used.

When fullerene-based materials are used to facilitate hole injection and regulate electron injection, current injection properties and life spans of OLEDs are improved. In addition, driving voltage is reduced and life span is increased without decreasing efficiency.

While the present invention has been described with reference to certain exemplary embodiments, those of ordinary skill in the art understand that various modifications to the described embodiments can be made without departing from the spirit and scope of the invention as recited in the attached claims.

What is claimed is:

1. An organic light emitting device comprising:
    a substrate;
    an anode formed on the substrate;
    a buffer layer formed on the anode and comprising a fullerene-based material;
    an organic emission layer formed on the buffer layer; and
    a cathode formed on the organic layer.

2. The device according to claim 1, wherein the fullerene-based material is selected from the group consisting of C60, C70, C76, C78, C82, C84, C90, C94, and C96.

3. The device according to claim 1, wherein the buffer layer has a thickness ranging from about 1 to about 5 nm.

4. The device according to claim 3, wherein the buffer layer has a thickness of about 5 nm.

5. The device according to claim 1, wherein the buffer layer is formed by vacuum deposition.

6. An organic light emitting device comprising:
    a substrate;
    an anode formed on the substrate;
    a buffer layer formed on the anode and comprising a fullerene-based material;
    at least one first layer selected from the group consisting of hole injection layers, hole transport layers and combinations thereof, wherein the hole injection layers and hole transport layers are doped with the fullerene-based material of the buffer layer and are formed on the buffer layer;
    an organic emission layer formed on the at least one first layer; and
    a cathode formed on the organic emission layer.

7. The device according to claim 6, wherein the fullerene-based material is selected from the group consisting of C60, C70, C76, C78, C82, C84, C90, C94, and C96.

8. The device according to claim 6, wherein the buffer layer has a thickness ranging from about 1 to about 5 nm.

9. The device according to claim 8, wherein the buffer layer has a thickness of about 5 nm.

10. The device according to claim 6, wherein the buffer layer is formed by vacuum deposition.

11. The device according to 6, wherein the hole injection layer comprises a material selected from the group consisting of CuPc, TNATA, TCTA, TDAPB, TDATA, PANI, and PEDOT.

12. The device according to claim 11, wherein the fullerene-based material is present in the hole injection layer at a concentration ranging from 1 to 30 wt % based on the total weight of the hole injection layer.

13. The device according to claim 6, wherein the hole transport layer comprises a material selected from the group consisting of NPD, TPD, s-TAD, MTDATA, and PVK.

14. The device according to claim 13, wherein the fullerene-based material is present in the hole transport layer at a concentration of about 2 wt % or less based on the total weight of the hole transport layer.

15. The device according to claim 14, wherein the fullerene-based material is present in the hole transport layer at a concentration of about 2 wt %.

16. The device according to claim 6, wherein the hole transport layer comprises a material having a lowest unoccupied molecular orbital (LUMO) that is lower in energy than a LUMO of the fullerene-based material.

17. The device according to claim 6, wherein the at least one layer is doped with the fullerene-based material using a method selected from the group consisting of vacuum deposition, spin coating, and ink-jet printing.

18. The device according to claim 6, wherein the at least one layer comprises multiple layers.

19. The device according to claim 6, further comprising at least one second layer selected from the group consisting of hole blocking layers, electron transport layers, and electron injection layers, wherein the at least one second layer is deposited on the organic emission layer.

20. An organic light emitting device comprising:
    a substrate;
    an anode formed on the substrate;
    a buffer layer formed on the anode and comprising a fullerene-based material;
    at least one first layer selected from the group consisting of hole injection layers, hole transport layers and combinations thereof, wherein the hole injection layers and hole transport layers are doped with the fullerene-based material of the buffer layer and are formed on the buffer layer;
    an organic emission layer formed on the at least one first layer;
    at least one second layer selected from the group consisting of hole blocking layers, electron transport layers, electron injection layers and combinations thereof, wherein the at least one second layer is formed on the organic emission layer; and
    a cathode formed on the at least one second layer.

* * * * *